(12) United States Patent
Chew et al.

(10) Patent No.: US 8,378,428 B2
(45) Date of Patent: Feb. 19, 2013

(54) METAL GATE STRUCTURE OF A SEMICONDUCTOR DEVICE

(75) Inventors: Han-Guan Chew, Singapore (SG); Lee-Wee Teo, Singapore (SG); Ming Zhu, Singapore (SG); Bao-Ru Young, Zhubei (TW); Harry-Hak-Lay Chuang, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 121 days.

(21) Appl. No.: 12/893,338

(22) Filed: Sep. 29, 2010

(65) Prior Publication Data

US 2012/0074475 A1    Mar. 29, 2012

(51) Int. Cl.
*H01L 21/02* (2006.01)

(52) U.S. Cl. ........ 257/388; 257/407; 257/412; 257/413; 257/E29.027; 438/157; 438/195; 438/283

(58) Field of Classification Search ........................ None
See application file for complete search history.

(56) References Cited

U.S. PATENT DOCUMENTS

| | | | |
|---|---|---|---|
| 2009/0096032 A1* | 4/2009 | Saitoh et al. | 257/369 |
| 2010/0048013 A1* | 2/2010 | Thei et al. | 438/591 |
| 2010/0127331 A1* | 5/2010 | Ratnakumar et al. | 257/365 |
| 2011/0074498 A1* | 3/2011 | Thompson et al. | 327/543 |

* cited by examiner

*Primary Examiner* — Benjamin Sandvik
*Assistant Examiner* — Scott R Wilson
(74) *Attorney, Agent, or Firm* — Lowe Hauptman Ham & Berner, LLP

(57) ABSTRACT

The applications discloses a semiconductor device comprising a substrate having a first active region, a second active region, and an isolation region having a first width interposed between the first and second active regions; a P-metal gate electrode over the first active region and extending over at least ⅔ of the first width of the isolation region; and an N-metal gate electrode over the second active region and extending over no more than ⅓ of the first width. The N-metal gate electrode is electrically connected to the P-metal gate electrode over the isolation region.

20 Claims, 10 Drawing Sheets

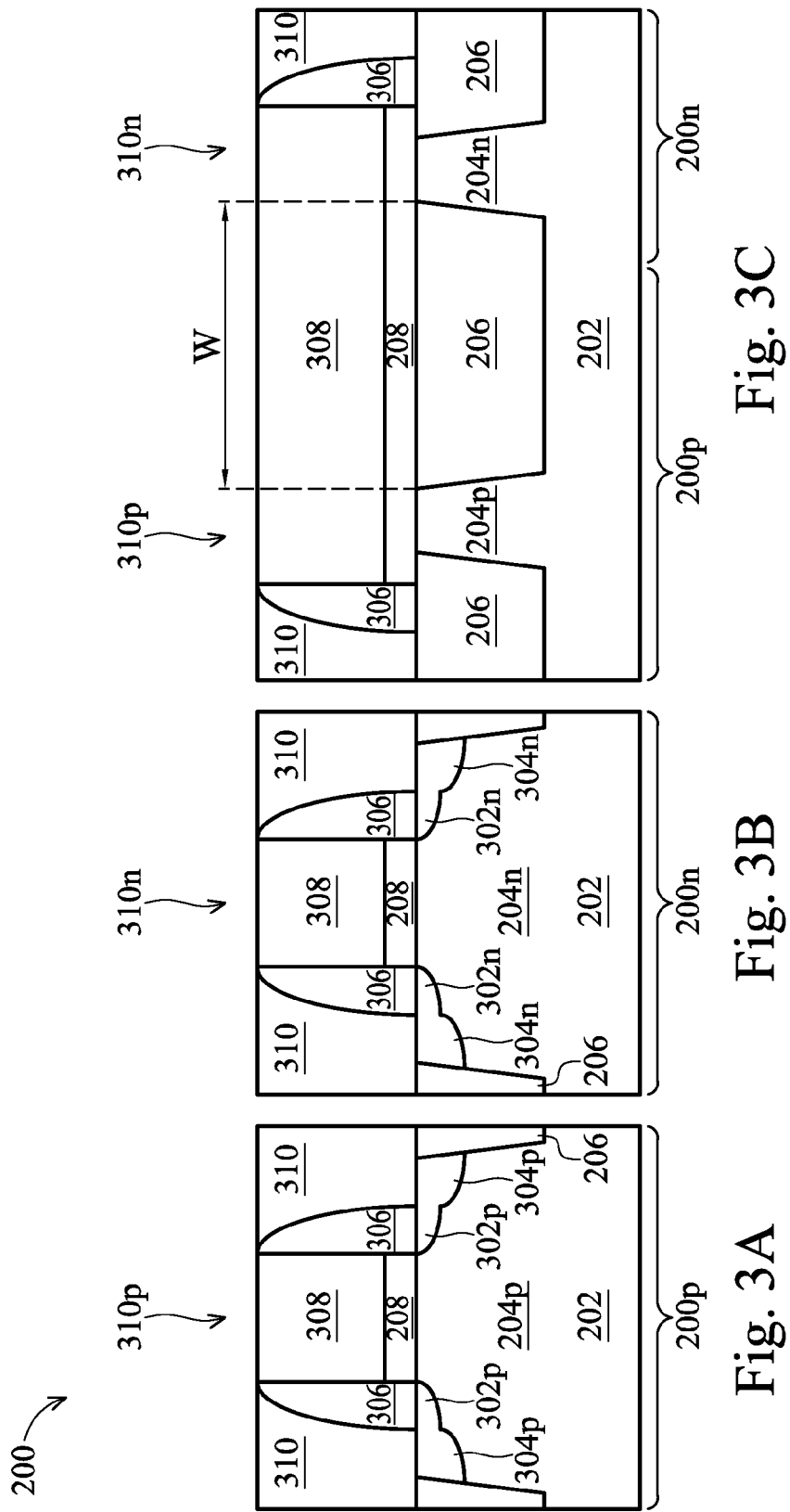

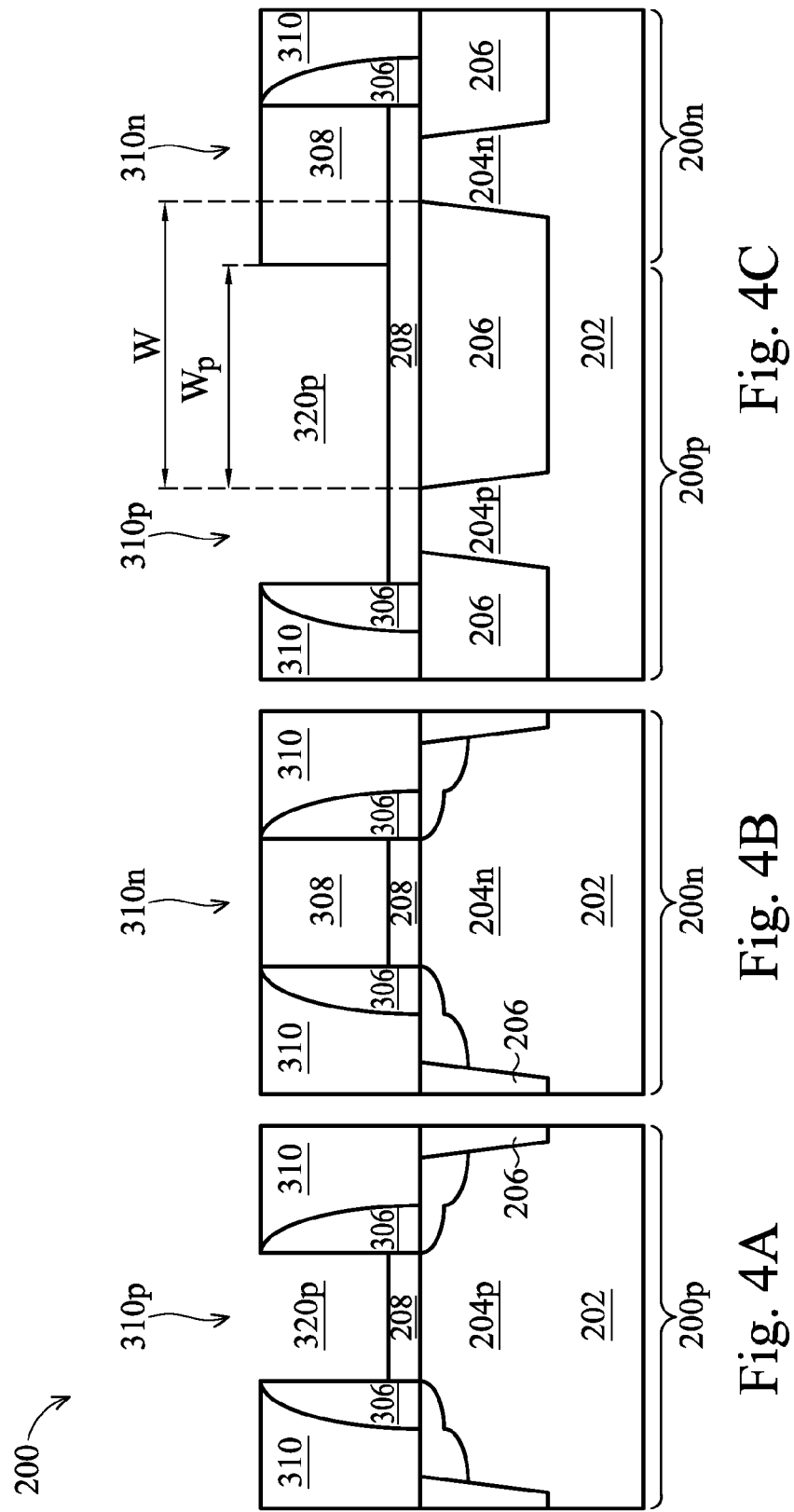

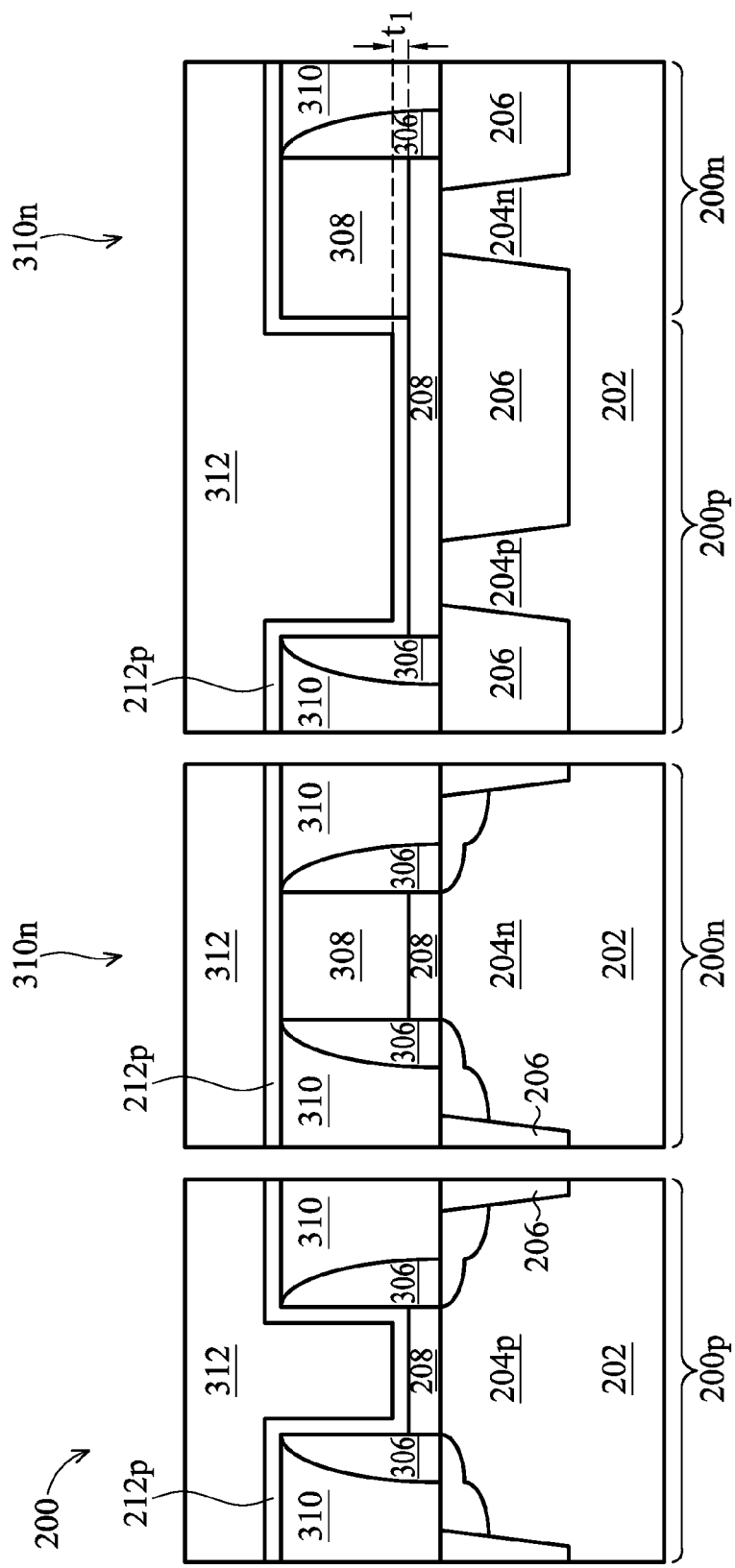

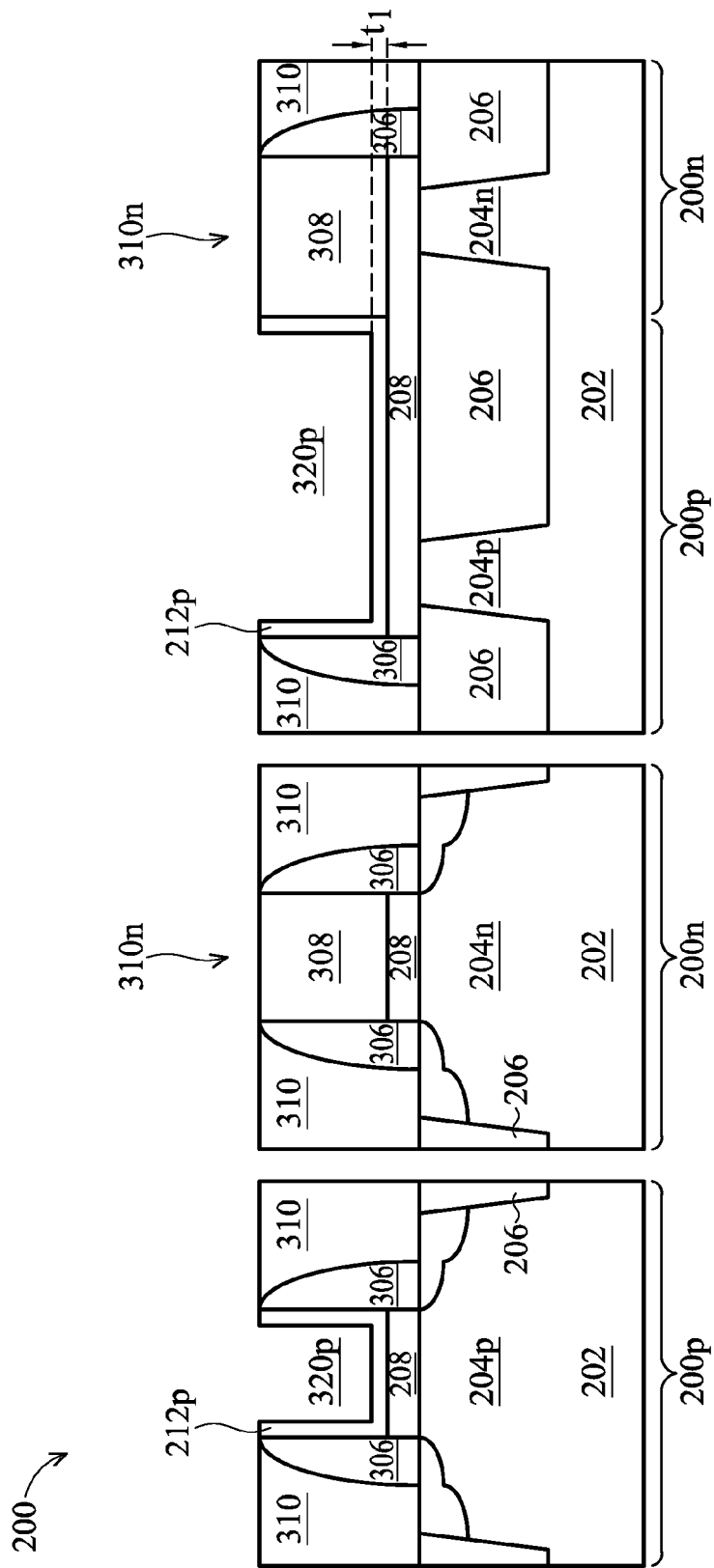

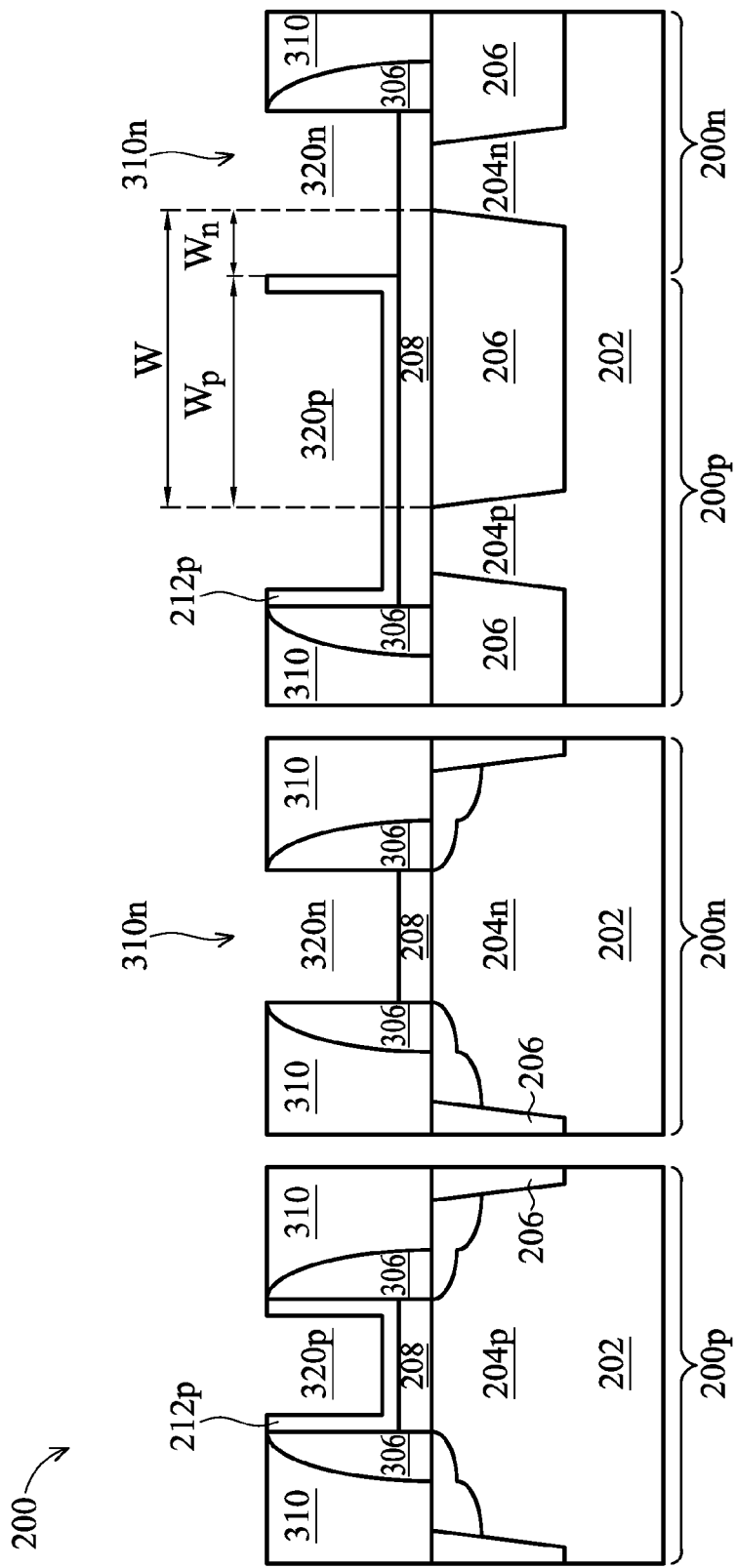

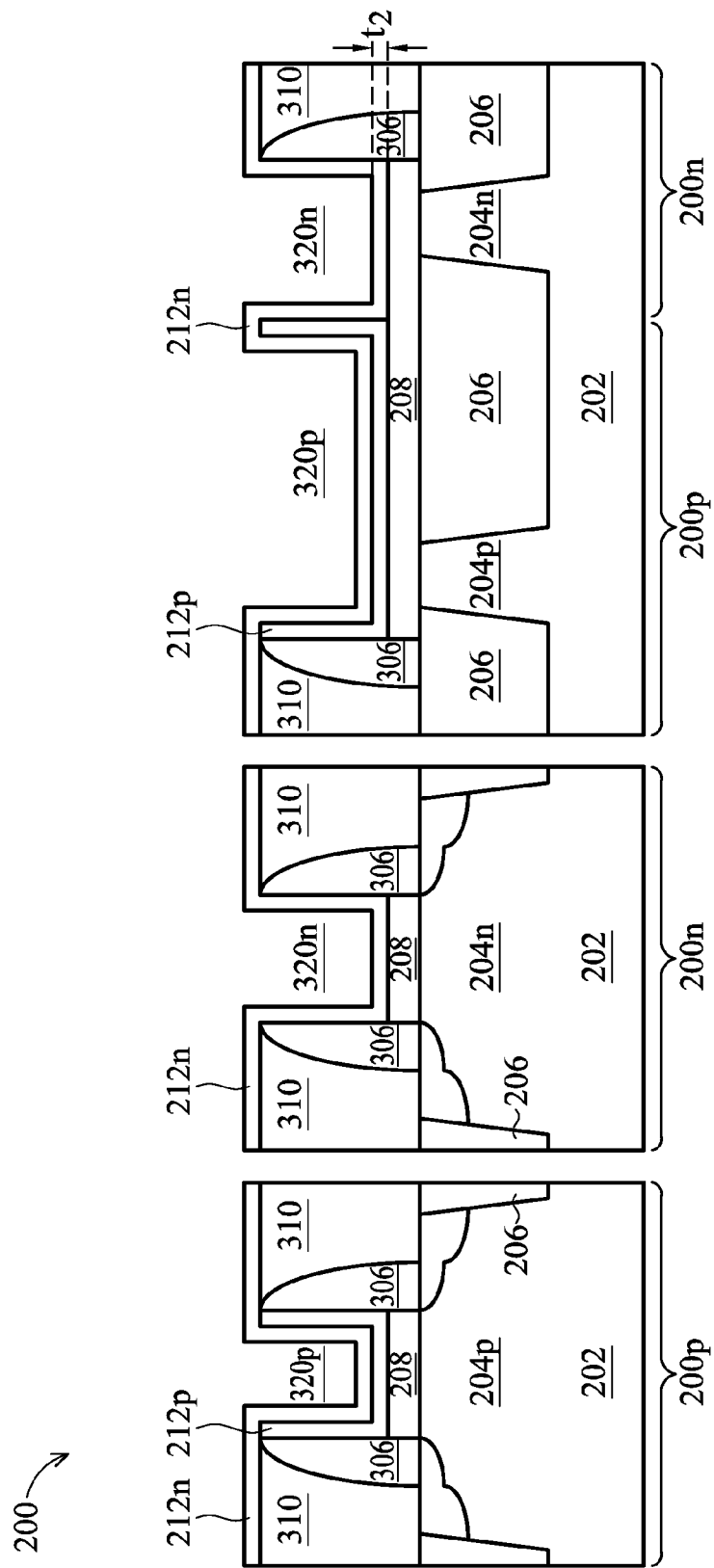

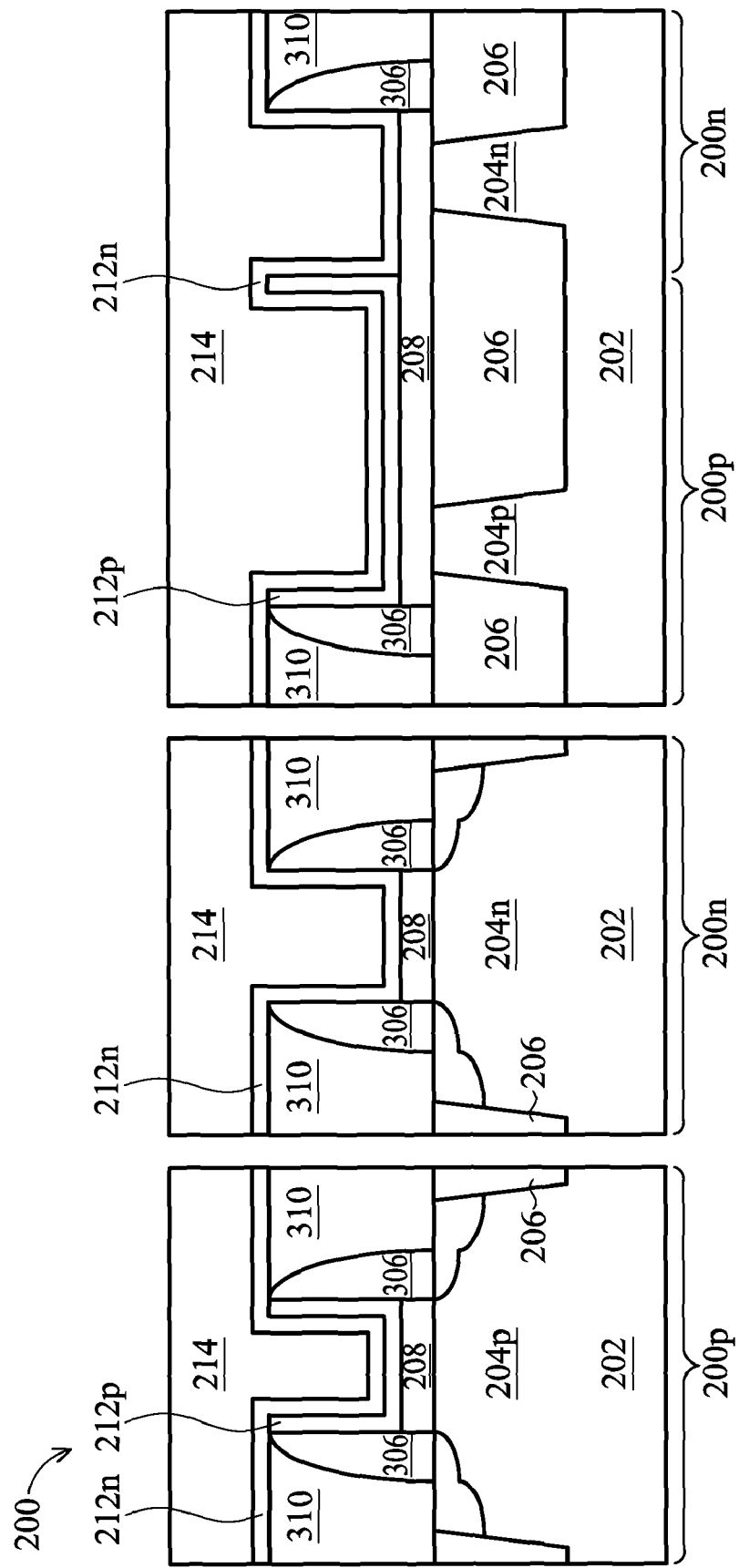

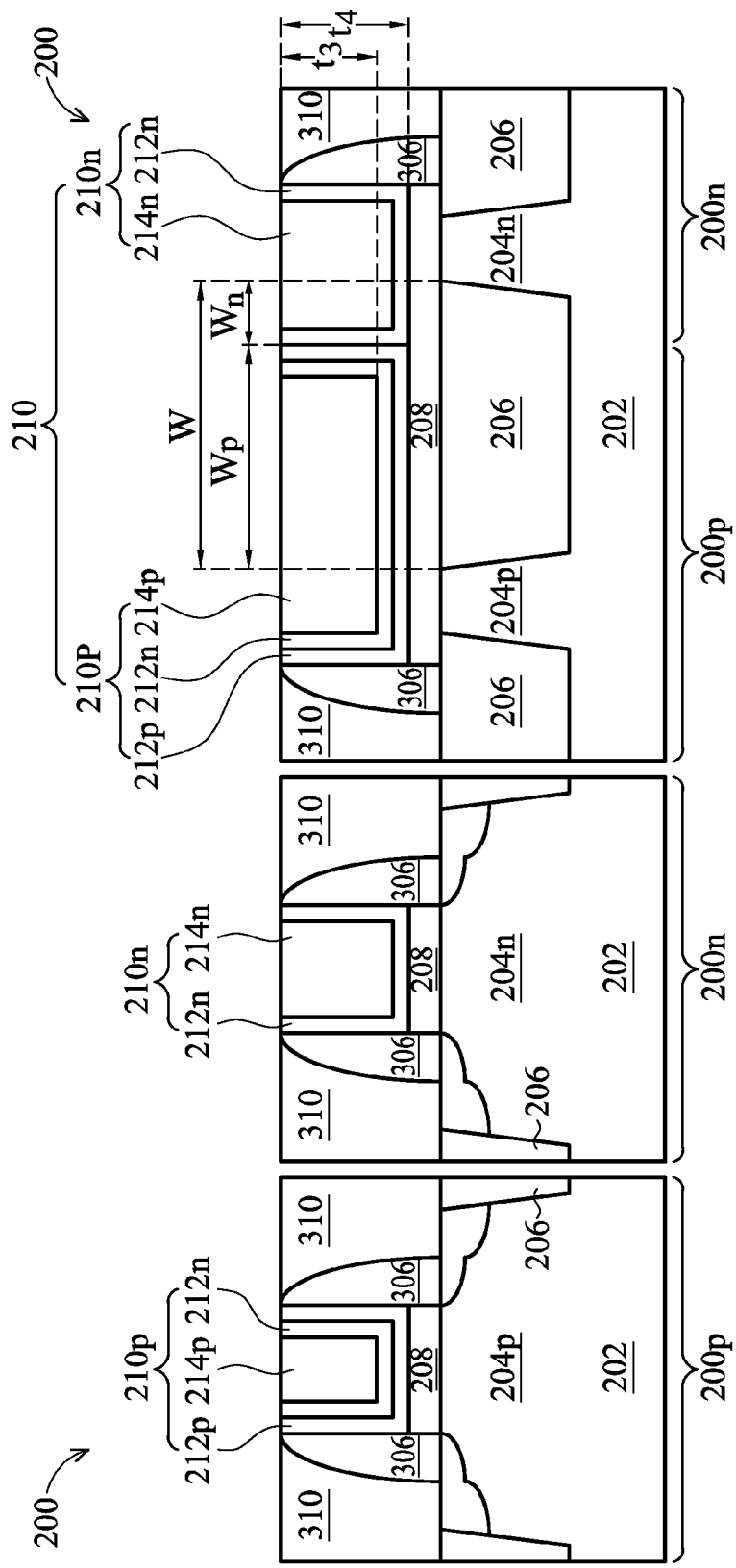

US 8,378,428 B2

METAL GATE STRUCTURE OF A SEMICONDUCTOR DEVICE

TECHNICAL FIELD

The disclosure relates to integrated circuit fabrication, and more particularly to a metal gate structure.

BACKGROUND

As technology nodes shrink, in some integrated circuit (IC) designs, there has been a desire to replace the typically polysilicon gate electrode with a metal gate electrode to improve device performance with the decreased feature sizes. One process of forming a metal gate structure is termed a "gate last" process in which the final gate structure is fabricated "last" which allows for a reduced number of subsequent processes, including high temperature processing, that must be performed after formation of the gate.

However, there are challenges to implementing such features and processes in complementary metal-oxide-semiconductor (CMOS) fabrication. As the gate length and spacing between devices decrease, these problems are exacerbated. For example, it is difficult to achieve a stable threshold voltage for all CMOS devices because atomic diffusion between adjacent gates causes shifts in the threshold voltage of CMOS devices, thereby increasing the likelihood of device instability and/or device failure.

Accordingly, what is needed is a metal gate structure in which the threshold voltage is less sensitive to process variation.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features in the drawings may be arbitrarily increased or reduced for clarity of discussion.

FIGS. 3-10 show cross-section views of the semiconductor device depicted in FIG. 2 at various stages of fabrication according to various aspects of the present disclosure.

DESCRIPTION

Figure 1:
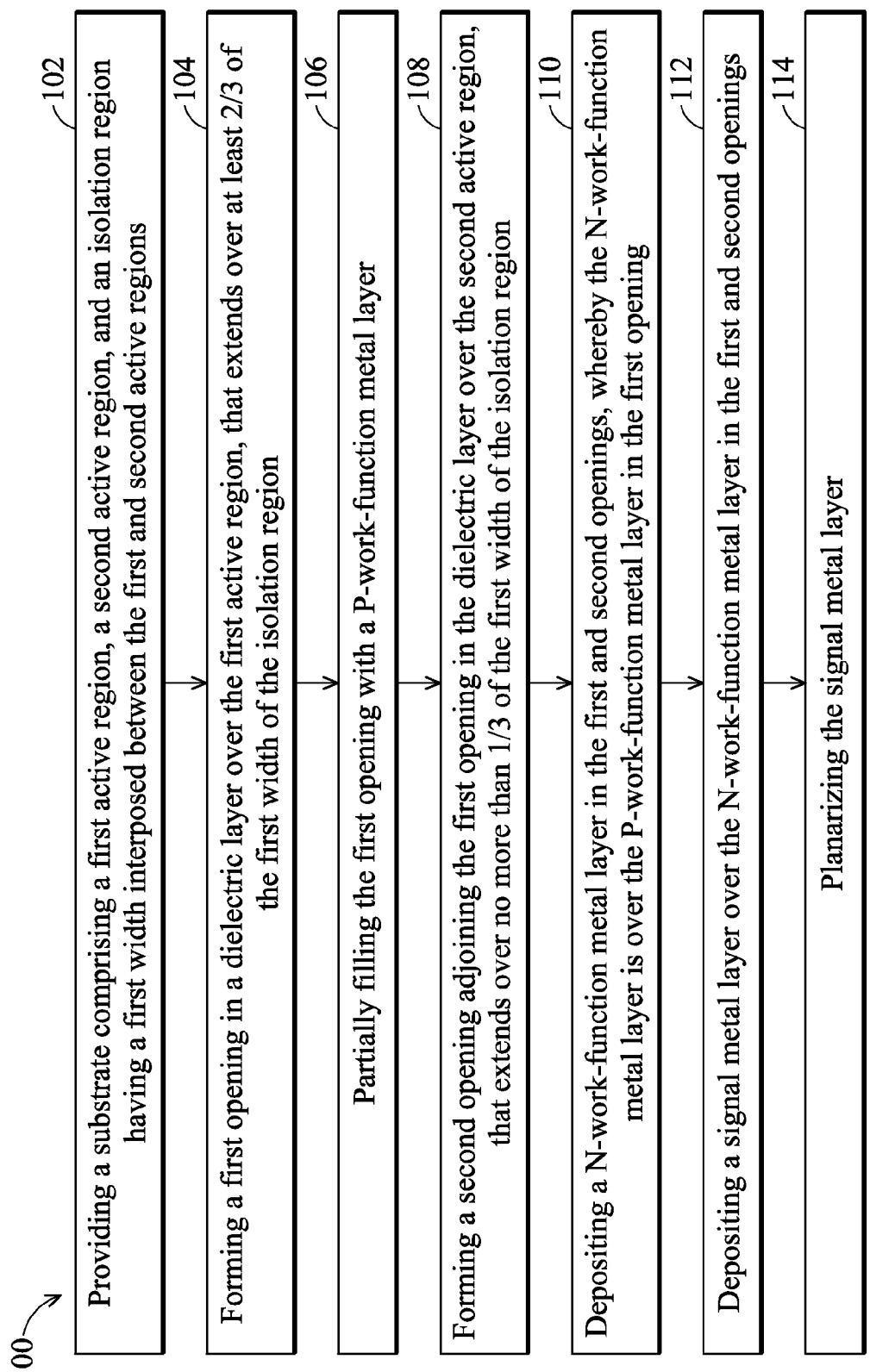
FIG. 1 is a flowchart illustrating a method for fabricating a semiconductor device comprising a metal gate structure according to various aspects of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity. Further, the present disclosure may repeat reference numerals and/or letters in the various examples. This repetition is for the purpose of simplicity and clarity and does not in itself dictate a relationship between the various embodiments and/or configurations discussed. In addition, the present disclosure provides examples of a "gate last" metal gate process, however, one skilled in the art may recognize applicability to other processes and/or use of other materials.

Figure 2:
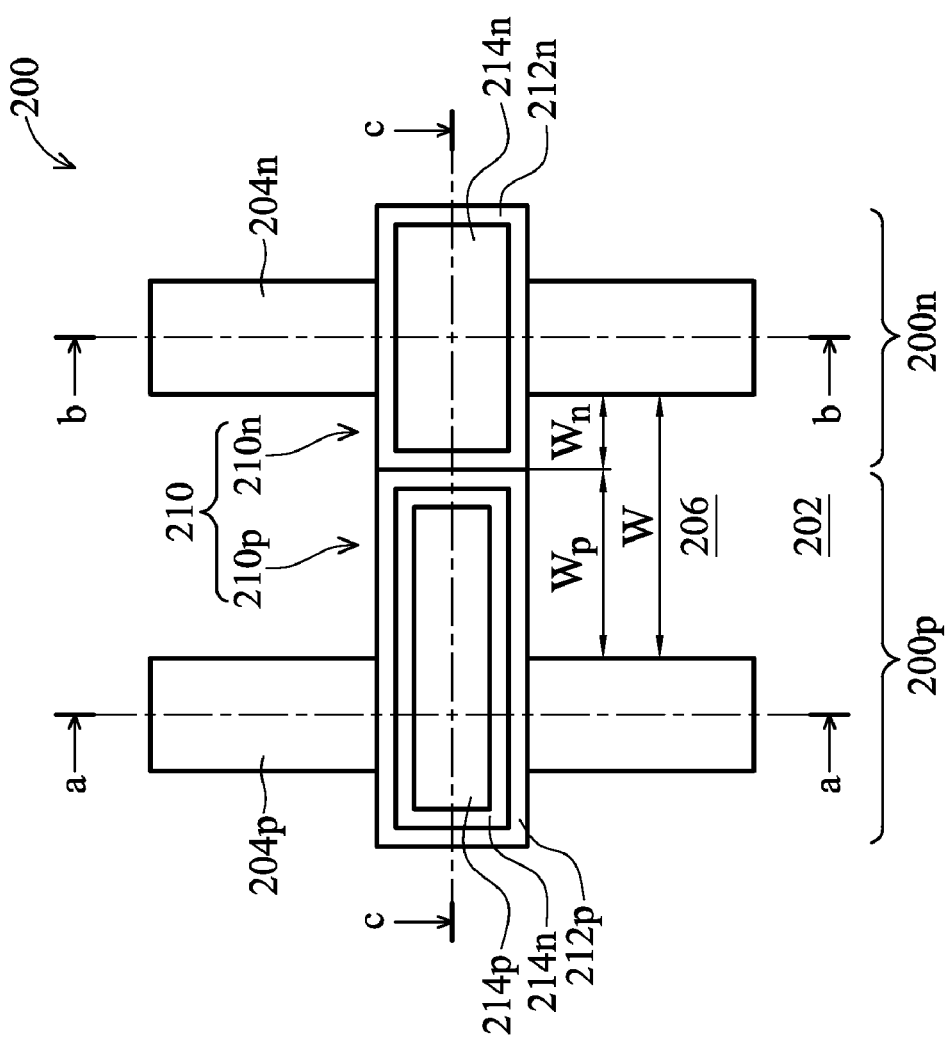
FIG. 2 shows a top view of a semiconductor device comprising a metal gate structure according to various aspects of the present disclosure.

FIG. 1 is a flowchart illustrating a method 100 for fabricating a semiconductor device 200 comprising a metal gate structure 210 (shown in FIGS. 2 and 10C) according to various aspects of the present disclosure. FIG. 2 shows a top view of a semiconductor device 200 comprising a metal gate structure 210 according to various aspects of the present disclosure. FIGS. 3-10 show cross-section views of the semiconductor device depicted in FIG. 2 at various stages of fabrication according to various aspects of the present disclosure. Each figure denoted with a letter "A" shows a cross-section view taken along the line a-a in FIG. 2; each figure denoted with a letter "B" shows a cross-section view taken along the line b-b in FIG. 2; and Each figure denoted with a letter "C" shows a cross-section view taken along the line c-c in FIG. 2. It is noted that part of the semiconductor device 200 may be fabricated with CMOS technology processing. Accordingly, it is understood that additional processes may be provided before, during, and after the method 100 of FIG. 1, and that some other processes may only be briefly described herein. Also, FIGS. 1 through 10C are simplified for a better understanding of the inventive concepts of the present disclosure. For example, although the figures illustrate a metal gate structure 210 for the semiconductor device 200, it is understood the semiconductor device 200 may be part of an IC that may comprise a number of other devices comprising resistors, capacitors, inductors, fuses, etc.

FIG. 2 shows a top view of a semiconductor device 200 comprising a metal gate structure 210 fabricated by a "gate last" process. A substrate 202 includes a first active region 204p, a second active region 204n, and an isolation region 206 having a first width W interposed between the first and second active regions 204p, 204n. The semiconductor device 200 comprises a p-type Metal Oxide Semiconductor Field Effect Transistor (pMOSFET) 200p and an n-type Metal Oxide Semiconductor Field Effect Transistor (nMOSFET) 200n.

The pMOSFET 200p is formed from a P-metal gate electrode 210p overlying a channel region of the first active region 204p. The P-metal gate electrode 210p may comprise, but not limited to, a P-work-function metal layer 212p and a first signal metal layer 214p. In one embodiment, the P-metal gate electrode 210p extends outside of the first active region 204p and electrically contacts to an N-metal gate electrode 210n of the nMOSFET 200n. In the present embodiment, the P-metal gate electrode 210p extends a distance Wp over at least ⅔ of the first width W of the isolation region 206. In one embodiment, the first width is in the range of 0.1 to 0.3 um.

The nMOSFET 200n is formed from the N-metal gate electrode 210n overlying a channel region of the second active region 204n. The N-metal gate electrode 210n may comprise, but not limited to, an N-work-function metal layer 212n and a second signal metal layer 214n. In one embodiment, the N-metal gate electrode 210n extends outside of the second active region 204n and electrically contacts to the P-metal gate electrode 210p. In the present embodiment, the N-metal gate electrode 210n extends a distance Wn over no more than ⅓ of the first width W of the isolation region 206. The combination of P-metal gate electrode 210p and N-metal gate electrode 210n is hereinafter referred to as a metal gate structure 210.

In the present embodiment, the P-metal gate electrode 210p may further comprise the N-work-function metal layer 212n interposed between the P-work-function metal layer 212p and the first signal metal layer 214p, thereby the P-metal gate electrode 210p can accommodate less signal metal material as compared with the N-metal gate electrode 210n due to insertion of the N-work-function metal layer 212n. In the present embodiment, the first signal metal layer 214p and the second signal metal layer 214n comprise the same low-resistance conductive material. If both the P-metal gate electrode 210p and the N-metal gate electrode 210n extends about ½ of the first width W of the isolation region 206 and electrically contacts to each other over the isolation region 206, a concentration gradient between the first signal metal layer 214p and the second signal metal layer 214n may drive the second signal metal layer 214n with more signal metal material to the P-work-function metal layer 212p, thereby changing work function of the P-work-function metal layer 212p resulting in an unstable threshold voltage of the pMOSFET 220p.

In the present embodiment, the P-metal gate electrode 210p extends a distance Wp over at least ⅔ of the first width W of the isolation region 206, which is longer than ½ of the first width W of the isolation region 206. Compared with the configuration having ½ of the first width W extension, the extension distance Wp of the P-metal gate electrode 210p can more effectively prevent atomic diffusion of the second signal metal layer 214n to the P-work-function metal layer 212p from degrading the performance of the pMOSFET 220p. Accordingly, Applicant's semiconductor device and the method of fabricating a semiconductor device 200 may help the P-metal gate electrode 210p maintain its original work function, thereby retaining the threshold voltage of the pMOSFET 200p and thus enhancing the device performance.

Further, FIGS. 3-10 show cross-section views of the semiconductor device depicted in FIG. 2 at various stages of fabrication according to various aspects of the present disclosure. Figures denoted with the letter "A" show schematic cross-sectional views of a pMOSFET 200p taken along the line a-a of FIG. 2 at various stages of fabrication according to various aspects of the present disclosure; Figures denoted with the letter "B" show schematic cross-sectional views of an nMOSFET 200n taken along the line b-b of FIG. 2 at various stages of fabrication according to various aspects of the present disclosure; and Figures denoted with the letter "C" show schematic cross-sectional views of a metal gate structure 210 taken along the line c-c of FIG. 2 at various stages of fabrication according to various aspects of the present disclosure.

Referring to FIGS. 3A, 3B, and 3C, the method 100 begins at step 102 wherein a substrate 202 is provided. The substrate 202 may comprise a silicon substrate. In some embodiments, the substrate 202 may alternatively comprise silicon germanium, gallium arsenic, or other suitable semiconductor materials. The substrate 202 may further comprise other features such as various doped regions, a buried layer, and/or an epitaxy layer. Furthermore, the substrate 202 may be a semiconductor on insulator such as silicon on insulator (SOI). In other embodiments, the semiconductor substrate 202 may comprise a doped epi layer, a gradient semiconductor layer, and/or may further include a semiconductor layer overlying another semiconductor layer of a different type such as a silicon layer on a silicon germanium layer. In other examples, a compound semiconductor substrate may comprise a multilayer silicon structure or a silicon substrate may include a multilayer compound semiconductor structure.

In the present embodiments, the semiconductor substrate 202 may comprise a first active region 204p for the pMOSFET 200p, a second active region 204n for the nMOSFET 200n, and an isolation region 206 having a first width W interposed between the first and second active regions 204p, 204n. The active regions 204p, 204n may include various doping configurations depending on various design requirements. For example, the first active region 204p is doped with n-type dopants, such as phosphorus or arsenic; the second active region 204n is doped with p-type dopants, such as boron or $BF_2$.

Isolation region 206 may be formed on the substrate 202 to isolate the various active regions 204p, 204n from each other. The isolation regions 206 may utilize isolation technology, such as local oxidation of silicon (LOCOS) or shallow trench isolation (STI), to define and electrically isolate the various active regions 204p, 204n. In the present embodiment, the isolation region 206 comprises a STI. The isolation regions 206 may comprise materials such as silicon oxide, silicon nitride, silicon oxynitride, fluoride-doped silicate glass (FSG), a low-k dielectric material, and/or combinations thereof. The isolation regions 206, and in the present embodiment, the STI, may be formed by any suitable process. As one example, the formation of the STI may include patterning the semiconductor substrate 202 by a photolithography process, etching a trench in the substrate 202 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Still referring to FIGS. 3A, 3B, and 3C, a gate dielectric layer 208 may be formed over the substrate 202. In some embodiments, the gate dielectric layer 208 may comprise silicon oxide, silicon nitride, silicon oxy-nitride, or high-k dielectric. High-k dielectrics comprise certain metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, or mixtures thereof. In the present embodiment, the gate dielectric layer 208 is a high-k dielectric layer comprising $HfO_x$ with a thickness in the range of about 10 to 30 angstroms. The gate dielectric layer 208 may be formed using a suitable process such as atomic layer deposition (ALD), chemical vapor deposition (CVD), physical vapor deposition (PVD), thermal oxidation, UV-ozone oxidation, or combinations thereof. The gate dielectric layer 208 may further comprise an interfacial layer (not shown) to reduce damage between the gate dielectric layer 208 and the substrate 202. The interfacial layer may comprise silicon oxide.

In a gate last process, a dummy gate electrode layer 308 is subsequently formed over the gate dielectric layer 208. In some embodiments, the dummy gate electrode layer 308 may comprise a single layer or multilayer structure. In the present embodiment, the dummy gate electrode layer 308 may comprise poly-silicon. Further, the dummy gate electrode layer 308 may be doped poly-silicon with uniform or gradient doping. The dummy gate electrode layer 308 may have a thickness in the range of about 30 nm to about 60 nm. The dummy electrode layer 308 may be formed using a low-pressure chemical vapor deposition (LPCVD) process. In one embodiment, the LPCVD process can be carried out in a standard LPCVD furnace at a temperature of about 580° C. to 650° C., and at a pressure of about 200 mTorr to 1 Torr, using silane ($SiH_4$) or dichlorosilane ($SiH_2Cl_2$) as the silicon source gas.

Then, the dummy gate electrode layer 308 and the gate dielectric layer 208 are patterned to produce the structure shown in FIG. 3A-3C. A layer of photoresist (not shown) is formed over the dummy gate electrode layer 308 by a suitable process, such as spin-on coating, and patterned to form a patterned photoresist feature over the dummy gate electrode layer 308 by a lithography patterning method. A width of the patterned photoresist feature is in the range of about 15 to 45 nm. The patterned photoresist feature can then be transferred using a dry etching process to the underlying layers (i.e., the gate dielectric layer 208 and the dummy gate electrode layer 308) to form a P-dummy gate stack 310p and an N-dummy gate stack 310n. The photoresist layer may be stripped thereafter.

In another example, a hard mask layer (not shown) is formed over the dummy gate electrode layer 308; a patterned photoresist layer is formed on the hard mask layer; the pattern of the photoresist layer is transferred to the hard mask layer and then transferred to the dummy gate electrode layer 308 and the gate dielectric layer 208 to form the P-dummy gate stack 310p or N-dummy gate stack 310n. The hard mask layer comprises silicon oxide. In some alternative embodiments, the hard mask layer may optionally comprise silicon nitride, and/or silicon oxynitride, and may be formed using a method such as CVD or PVD. The hard mask layer comprises a thickness in the range from about 100 to 800 angstroms.

It is noted that the semiconductor device 200 may undergo other "gate last" processes and other CMOS technology processing to form various features of the semiconductor device 200. As such, the various features are only briefly discussed herein. The various components of the semiconductor device 200 may be formed prior to formation of the P-metal gate electrode 212p and N-metal gate electrode 212n in a "gate last" process. The various components may comprise lightly doped source/drain regions (p-type and n-type LDD) 302p, 302n and source/drain regions (p-type and n-type S/D) 304p, 304n in the active regions 204p, 204n and on opposite sides of the P-dummy gate stack 310p and N-dummy gate stack 310n. The p-type LDD 302p and S/D 304p regions may be doped with B or In, and the n-type LDD 302n and S/D 304n regions may be doped with P or As. The various features may further comprise gate spacers 306 and an interlayer dielectric (ILD) layer 310 on opposite sidewalls of the P-dummy gate stack 310p and N-dummy gate stack 310n. The gate spacers 306 may be formed of silicon oxide, silicon nitride or other suitable materials. The ILD layer 310 may include an oxide formed by a high-aspect-ratio process (HARP) and/or a high-density-plasma (HDP) deposition process.

The method 100 in FIG. 1 continues with step 104 in which the structure in FIGS. 4A, 4B, and 4C is produced by forming a first opening 320p in a dielectric layer (i.e., between the gate spacers 306) over the first active region 204p, that extends over at least ⅔ of the first width W of the isolation region 206. In the present embodiment, using the gate spacers 306 as hard masks, the dummy gate electrode layer 308 of the P-dummy gate stack 310p are removed to form the first opening 320p in the gate spacers 306, while the dummy gate electrode layer 308 of the N-dummy gate stack 310n is covered by a patterned photoresist layer. The first opening 320p between the gate spacers 306 is over the first active region 204p and extends a distance Wp over at least ⅔ of the first width W of the isolation region 206. The dummy gate electrode layer 308 of the P-dummy gate stack 310p may be removed using a dry etch process. In one embodiment, the dry etch process may be performed under a source power of about 650 to 800 W, a bias power of about 100 to 120 W, and a pressure of about 60 to 200 mTorr, using $Cl_2$, HBr and He as etching gases.

The method 100 in FIG. 1 continues with step 106 in which the structure in FIGS. 6A, 6B and 6C is produced by partially filling the first opening 320p with a P-work-function metal layer 212p. The P-work-function metal layer 212p comprises a material selected from a group of TiN, WN, TaN, Ru, or combinations thereof. The P-work-function metal layer 212p may be formed by CVD, PVD or other suitable technique. The P-work-function metal layer 212p has a thickness $t_1$ ranging from about 30 to 80 angstroms.

In some embodiments, an optional first barrier layer (not shown) may be deposited before the P-work-function metal layer 212p deposition to reduce diffusion of the signal metal layers 214p, 214n (shown in FIGS. 2 and 10) to the gate dielectric layer 208. Thus, in the first opening 320p the first barrier layer surrounds the P-work-function metal layer 212p, and a bottom portion of the first barrier layer is between the P-work-function metal layer 212p and gate dielectric layer 208. The first barrier layer comprises a material selected from a group of TaN and WN. The first barrier layer has a thickness ranging from 5 to 15 angstroms. The first barrier layer may be formed by CVD, PVD or other suitable technique. Thus the first barrier layer and P-work-function metal layer 212p may electrically contact to each other over the isolation region 206. Thus the first barrier layer and N-work-function metal layer 212n may electrically contact to each other over the isolation region 206.

In the present embodiment, the P-work-function metal layer 212p is first deposited over the gate dielectric layer 208, gate spacers 306, and ILD 310 layer to partially fill the first opening 320p. The next step is to deposit a sacrificial layer 312 (shown in FIGS. 5A, 5B and 5C) over the P-work-function metal layer 212p to substantially fill the first opening 320p. The sacrificial layer 312 may comprise, but is not limited to, poly-silicon, photo-resist (PR) or Spin-on glass (SOG). The sacrificial layer 312 may be formed by CVD, PVD, ALD, spin-on or other suitable technique.

Then, a chemical mechanical polishing (CMP) process is performed to remove a portion of the sacrificial layer 312 and the P-work-function metal layer 212p outside of the first opening 320p. Accordingly, the CMP process may stop when reaching the ILD layer 310, and thus providing a substantially planar surface. Finally, the remaining sacrificial layer 312 within the first opening 320p is removed by a dry etching process and/or a wet etching process to expose the P-work-function metal layer 212p (shown in FIGS. 6A, 6B and 6C). For example, if the sacrificial layer 312 comprises poly-silicon, PR, or SOG, the dry/wet etching chemistry may include F, Cl, and Br based etchants to selectively remove the remaining sacrificial layer 312 within the first opening 320p.

The method 100 in FIG. 1 continues with step 108 in which the structure in FIGS. 7A, 7B and 7C is produced by forming a second opening 320n adjoining the first opening 320p in the dielectric layer (i.e., between the gate spacers 306) over the second active region 204n, that extends over no more than ⅓ of the first width W of the isolation region 206. In one embodiment, using the gate spacers 306 and remaining P-work-function metal layer 212p as hard masks, the dummy gate electrode layer 308 of the N-dummy gate stack 310n is removed to form a second opening 320n in the gate spacers 306. The second opening 320n between the gate spacers 306 is over the second active region 204n and extends a distance Wn over no more than ⅓ of the first width W of the isolation region 206. The dummy gate electrode layer 308 of the N-dummy gate stack 310n may be removed using a wet etch and/or a dry etch process. In one embodiment, the wet etch process includes exposure to a hydroxide solution containing ammonium hydroxide, diluted HF, deionized water, and/or other suitable etchant solutions. In another embodiment, the dry etch process may be performed under a source power of about 650 to 800 W, a bias power of about 100 to 120 W, and a pressure of about 60 to 200 mTorr, using $Cl_2$, HBr and He as etching gases.

The method 100 in FIG. 1 continues with step 110 in which the structure in FIGS. 8A, 8B and 8C is produced by depositing an N-work-function metal layer 212n in the first and second openings 320p, 320n, whereby the N-work-function metal layer 212n is over the P-work-function metal layer 212p in the first opening 320p. The N-work-function metal layer 212n comprises a material selected from a group of Ti, Ag, Al, TiAl, TiAlN, TaC, TaCN, TaSiN, Mn, and Zr. The N-work-function metal layer 212n has a thickness $t_2$ ranging from about 30 to 80 angstroms. The N-work-function metal layer 212n may be formed by CVD, PVD or other suitable technique. Thus the N-work-function metal layer 212n and the P-work-function metal layer 212n electrically contact to each other over the isolation region 206. Further, the N-work-function metal layer 212n is over the P-work-function metal layer 212p in the first opening 320p.

In some embodiments, an optional second barrier layer (not shown) may be deposited before the N-work-function metal layer 212n deposition to reduce diffusion of the signal metal layers 214p, 214n (shown in FIGS. 2 and 10) into the gate dielectric layer 208. In the first opening 320p the second barrier layer is between the N-work-function metal layer 212n and P-work-function metal layer 212p. Further, in the second opening 320n the second barrier layer surrounds the N-work-function metal layer 212n, and a bottom portion of the second barrier layer is between the N-work-function metal layer 212n and gate dielectric layer 208. The second barrier layer comprises a material selected from a group of TaN, WN, or combinations thereof. The second barrier layer has a thickness ranging from 5 to 15 angstroms. The second barrier layer may be formed by CVD, PVD or other suitable technique. Thus the second barrier layer and P-work-function metal layer 212p may electrically contact to each other over the isolation region 206; the second barrier layer and N-work-function metal layer 212n may electrically contact to each other over the isolation region 206; and the second barrier layer and first barrier layer may electrically contact to each other over the isolation region 206.

The method 100 in FIG. 1 continues with step 112 in which the structure in FIGS. 9A, 9B and 9C is produced by depositing a signal metal layer 214 over the N-work-function metal layer 212n in the first and second openings 320p, 320n. The signal metal layer 214 comprises a material selected from a group of Al, Cu, W, or combination thereof. The signal metal layer 214 may be formed by CVD, PVD or other suitable technique.

In some embodiments, an optional third barrier layer (not shown) may be deposited before deposition of the signal metal layer 214 to reduce diffusion of the signal metal layers 214p, 214n (shown in FIGS. 2 and 10) into the gate dielectric 208. Thus the third barrier layer is between the N-work-function metal layer 212n and the signal metal layer 214. The third barrier layer comprises a material selected from a group of TiN, TaN, WN, or combination thereof. The third barrier layer has a thickness ranging from 20 to 40 angstroms. The third barrier layer may be formed by CVD, PVD or other suitable technique.

The method 100 in FIG. 1 continues with step 114 in which the structure in FIGS. 2, 10A, 10B and 10C is produced by planarizing the signal metal layer 214. A CMP is performed to remove the signal metal layer 214 and N-work-function metal layer 212n outsides of the first and second openings 320p, 320n. Accordingly, the CMP process may stop when reaching the ILD layer 310, and thus providing a substantially planar surface. The signal metal layer 214 in the first openings 320p is referred to as a first signal metal layer 214p, and the signal metal layer 214 in the second openings 320n is referred to as a second signal metal layer 214n. In the present embodiment, a maximum thickness $t_3$ of the first signal metal layer 214p is less than a maximum thickness $t_4$ of the second signal metal layer 214n. For example, the first signal metal layer 214p has a maximum thickness $t_3$ ranging from 350 to 450 angstroms, and the second signal metal layer 214n has a maximum thickness $t_4$ ranging from 380 to 500 angstroms.

Thus, the P-metal gate electrode 210p may comprise, but not limited to, the P-work-function metal layer 212p, N-work-function metal layer 212n and first signal metal layer 214p. The N-metal gate electrode 210n may comprise, but not limited to, the N-work-function metal layer 212n and second signal metal layer 214n. The combination of P-metal gate electrode 210p and N-metal gate electrode 210n is referred to as a metal gate structure 210.

Although the increased thickness of the second signal metal layer 214n may create concentration gradient to drive the second signal metal layer 214n with more signal metal material to the P-work-function metal layer 212p, the longer extension distance Wp of the P-metal gate electrode 210p can be more effective to avoid atomic diffusion of the second signal metal layer 214n to the P-work-function metal layer 212p. Accordingly, Applicant's method of fabricating a semiconductor device 200 may fabricate the P-metal gate electrode 210p maintaining its work function, thereby not changing the threshold voltage of the pMOSFET 200p and thus enhancing the device performance.

It is understood that the semiconductor device 200 may undergo further CMOS processes to form various features such as contacts/vias, interconnect metal layers, dielectric layers, passivation layers, etc. It has been observed that the modified P-metal gate electrode 210p provides a stable work function to maintain a stable threshold voltage of the pMOSFET 200p, thereby enhancing the device performance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    a substrate comprising a first active region, a second active region, and an isolation region having a first width interposed between the first and second active regions;
    a P-metal gate electrode over the first active region and extending over at least ⅔ of the first width of the isolation region; and
    an N-metal gate electrode over the second active region and extending over no more than ⅓ of the first width, the N-metal gate electrode electrically connected to the P-metal gate electrode over the isolation region.

2. The semiconductor device of claim 1, wherein the first width ranges from 0.1 to 0.3 um.

3. The semiconductor device of claim 1, wherein the P-metal gate electrode comprises a P-work-function metal layer.

4. The semiconductor device of claim 3, wherein a thickness of the P-work-function metal layer ranges from 30 to 80 angstroms.

5. The semiconductor device of claim 3, wherein the P-work-function metal layer is TiN.

6. The semiconductor device of claim 3, wherein the P-work-function metal layer comprises a material selected from a group of TiN, WN, TaN, or Ru.

7. The semiconductor device of claim 3, wherein the P-metal gate electrode further comprises a first signal metal layer over the P-work-function metal layer.

8. The semiconductor device of claim 7, wherein the P-metal gate electrode further comprises an N-work-function metal layer interposed between the P-work-function metal layer and the first signal metal layer.

9. The semiconductor device of claim 3, wherein the P-metal gate electrode further comprises a first barrier layer surrounding the P-work-function metal layer.

10. The semiconductor device of claim 1, wherein the N-metal gate electrode comprises an N-work-function metal layer.

11. The semiconductor device of claim 10, wherein a thickness of the N-work-function metal layer ranges from 30 to 80 angstroms.

12. The semiconductor device of claim 10, wherein the N-work-function metal layer is TiAl.

13. The semiconductor device of claim 10, wherein the N-work-function metal layer comprises a material selected from a group of Ti, Ag, Al, TiAl, TiAlN, TaC, TaCN, TaSiN, Mn, or Zr.

14. The semiconductor device of claim 10, wherein the N-metal gate electrode further comprises a second signal metal layer over the N-work-function metal layer.

15. The semiconductor device of claim 10, wherein the N-metal gate electrode further comprises a second barrier layer surrounding the N-work-function metal layer.

16. The semiconductor device of claim 1, wherein the P-metal gate electrode comprises a first signal metal layer and the N-metal gate electrode comprises a second signal metal layer, wherein a first thickness of the first signal metal layer is less than a second thickness of the second signal metal layer.

17. A method of fabricating a metal gate structure over a substrate comprising a first active region, a second active region, and an isolation region having a first width interposed between the first and second active regions, the method comprising:
    forming a first opening in a dielectric layer over the first active region, the first opening extending over at least ⅔ of the first width of the isolation region;
    partially filling the first opening with a P-work-function metal layer;
    forming a second opening adjoining the first opening in the dielectric layer over the second active region, the second opening extending over no more than ⅓ of the first width of the isolation region;
    depositing an N-work-function metal layer in the first and second openings, whereby the N-work-function metal layer is over the P-work-function metal layer in the first opening;
    depositing a signal metal layer over the N-work-function metal layer in the first and second openings; and
    planarizing the signal metal layer.

18. The method of claim 17, wherein the first width ranges from 0.1 to 0.3 um.

19. The method of claim 17, wherein the P-work-function metal layer comprises a material selected from a group of TiN, WN, TaN, or Ru.

20. The method of claim 17, wherein the N-work-function metal layer comprises a material selected from a group of Ti, Ag, Al, TiAl, TiAlN, TaC, TaCN, TaSiN, Mn, or Zr.

* * * * *